United States Patent
Wang

(10) Patent No.: US 9,645,620 B2
(45) Date of Patent: May 9, 2017

(54) ELECTRONIC SYSTEM AND EXPANSION BASE THEREOF

(71) Applicant: ASUSTek COMPUTER INC., Taipei (TW)

(72) Inventor: Cheng-Yu Wang, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 35 days.

(21) Appl. No.: 14/705,975

(22) Filed: May 7, 2015

(65) Prior Publication Data

US 2015/0327400 A1   Nov. 12, 2015

(30) Foreign Application Priority Data

May 7, 2014   (TW) .............................. 103116260 A

(51) Int. Cl.
*G06F 1/20* (2006.01)
*H05K 7/20* (2006.01)
*G06F 1/16* (2006.01)

(52) U.S. Cl.
CPC ............ *G06F 1/203* (2013.01); *G06F 1/1632* (2013.01); *H05K 7/20154* (2013.01); *H05K 7/20263* (2013.01); *G06F 2200/201* (2013.01)

(58) Field of Classification Search
CPC .............................. G06F 1/1632; G06F 1/0203
See application file for complete search history.

(56) References Cited

U.S. PATENT DOCUMENTS

| | | | | |
|---|---|---|---|---|
| 6,966,358 B2 * | 11/2005 | Rapaich | ................ | G06F 1/1632 165/104.33 |
| 7,295,436 B2 * | 11/2007 | Cheon | ....................... | G06F 1/20 165/104.33 |
| 7,663,876 B2 | 2/2010 | Lin | | |
| 7,905,712 B2 * | 3/2011 | Huang | .................. | F04D 29/586 310/216.023 |
| 8,405,975 B2 * | 3/2013 | Helberg | ................ | G06F 1/1632 165/104.33 |

(Continued)

FOREIGN PATENT DOCUMENTS

| | | |
|---|---|---|
| TW | M342531 | 10/2008 |
| TW | 200933350 | 8/2009 |

(Continued)

*Primary Examiner* — Robert J Hoffberg
(74) *Attorney, Agent, or Firm* — Jianq Chyun IP Office

(57) ABSTRACT

An electronic system includes an expansion base and an electronic device. The expansion base includes a base body, a first pipe line, a liquid cooler and a driving unit. The base body includes a first connecting portion disposed in the base body. The liquid cooler is connected to the first connecting portion via the first pipe line. The driving unit connects the first pipe line. The electronic device includes a main body, a second pipe line and a liquid block. The main body includes a second connecting portion, and the second pipe line is connected to the second connection portion. The liquid block is connected to the second connecting portion via the second pipe line. The first connecting portion can be connected to the second connecting portion to form a circulation flow channel to drive heat exchange medium in the circulation flow channel by the driving unit.

5 Claims, 5 Drawing Sheets

(56) References Cited

U.S. PATENT DOCUMENTS

| | | | | |
|---|---|---|---|---|
| 8,416,572 B2* | 4/2013 | Olsen | ............... | G06F 1/20 |
| | | | | 165/104.33 |
| 8,493,735 B2* | 7/2013 | Iijima | ............... | G06F 1/20 |
| | | | | 361/679.53 |
| 2004/0008483 A1* | 1/2004 | Cheon | ............... | G06F 1/20 |
| | | | | 361/679.53 |
| 2005/0178529 A1 | 8/2005 | Suzuki | | |
| 2008/0283224 A1* | 11/2008 | Ma | ............... | F04B 43/04 |
| | | | | 165/104.31 |
| 2008/0283225 A1* | 11/2008 | Ma | ............... | F04B 43/04 |
| | | | | 165/104.33 |
| 2009/0178783 A1 | 7/2009 | Lin | | |
| 2013/0283253 A1 | 10/2013 | Hwang et al. | | |

FOREIGN PATENT DOCUMENTS

| | | |
|---|---|---|
| TW | 201013144 | 4/2010 |
| TW | M462681 | 10/2013 |
| TW | 201345114 | 11/2013 |

\* cited by examiner

… (1)

ELECTRONIC SYSTEM AND EXPANSION BASE THEREOF

CROSS-REFERENCE TO RELATED APPLICATION

This application claims the priority benefit of TW application serial No. 103116260, filed on May 7, 2014. The entirety of the above-mentioned patent applications is hereby incorporated by reference herein and made a part of specification.

BACKGROUND OF THE INVENTION

Field of the Invention

The disclosure relates to an electronic system and, more particularly, to an electronic system including a liquid cooling device.

Description of the Related Art

With computer technology development, an operating speed of an electronic device (such as a notebook computer or a tablet computer) is gradually improved, in which a heating power of a central processing unit (CPU) and a graphics processing unit (GPU) of the electronic device increase gradually.

Generally, the electronic device cools the heating elements via heat dissipating components, such as heat pipes, heat dissipating fins or heat dissipating fans. However, when the electronic device operates in high power and the heating power of the heating elements increases significantly, the heat dissipating components of the electronic device cannot reduce a temperature of the heating elements effectively, which limits an efficiency of the electronic device.

BRIEF SUMMARY OF THE INVENTION

An electronic system includes an expansion base and an electronic device. The expansion base includes a base body, a first pipe line, a liquid cooler and a driving unit. The base body includes a first connecting portion. The first pipe line is disposed in the base body. The liquid cooler is connected to the first connecting portion via the first pipe line. The driving unit is connected to the first pipe line. The electronic device includes a main body, a second pipe line and a liquid block. The main body includes a second connecting portion, and the second pipe line is connected to the second connection portion. The liquid block is connected to the second connecting portion via the second pipe line. The first connecting portion is connected to the second connecting portion to form a circulation flow channel to drive heat exchange medium in the circulation flow channel by the driving unit.

An expansion base applied to an electronic device is provided. The expansion base includes a base body, a first pipe line, a liquid cooler and a driving unit. The base body includes a first connecting portion. The first pipe line is disposed in the base body and connected to the first connecting portion. The liquid cooler is connected to the first connecting portion via the first pipe line; and heat exchange medium is driven by the driving unit.

When the electronic device is assembled to the expansion base, the first connecting portion of the expansion base can be connected to the second connecting portion of the electronic device, and the liquid cooler and the first pipe line of the expansion base are connected to the liquid block and the second pipe line of the electronic device to form the circulation flow channel. When the driving unit drives heat exchange medium in the circulation flow channel, the heat generated by the electronic device can be transferred to the expansion base via heat exchange medium, and the heat is dissipated via the liquid cooler of the expansion base effectively, and the heat dissipating efficiency of the electronic device is thus improved.

BRIEF DESCRIPTION OF THE DRAWINGS

These and other features, aspects and advantages of the disclosure will become better understood with regard to the following embodiments and accompanying drawings.

DETAILED DESCRIPTION OF THE EMBODIMENTS

Figure 1:
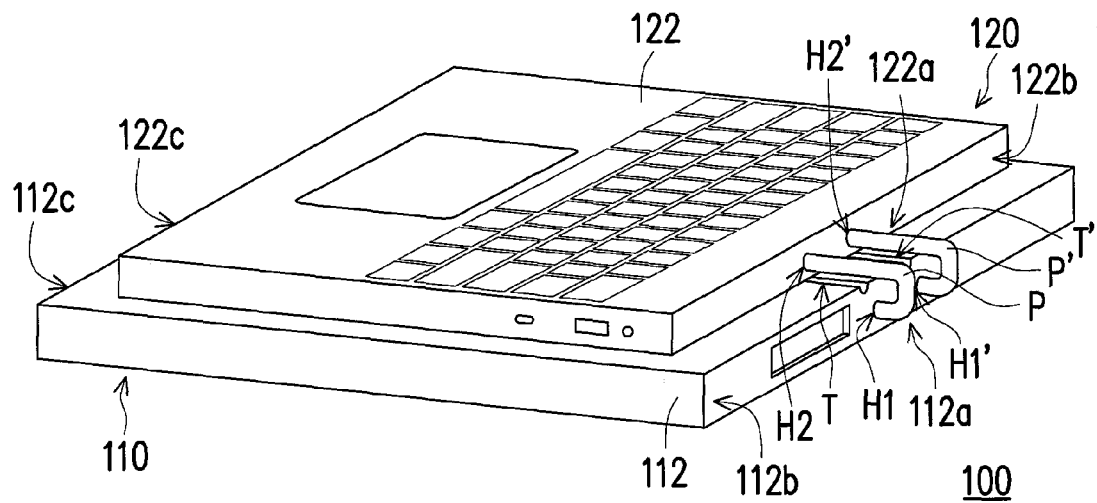
FIG. 1 is a stereogram showing an electronic system in an embodiment.

FIG. 1 is a stereogram showing an electronic system in an embodiment. Please refer to FIG. 1, in the embodiment, an electronic system 100 includes an expansion base 110 and an electronic device 120. The electronic device 120 is a notebook computer, which is not limited herein. Only a host of the notebook computer is shown in FIG. 1, and a screen thereof is omitted to make the drawing clear.

Figure 2:
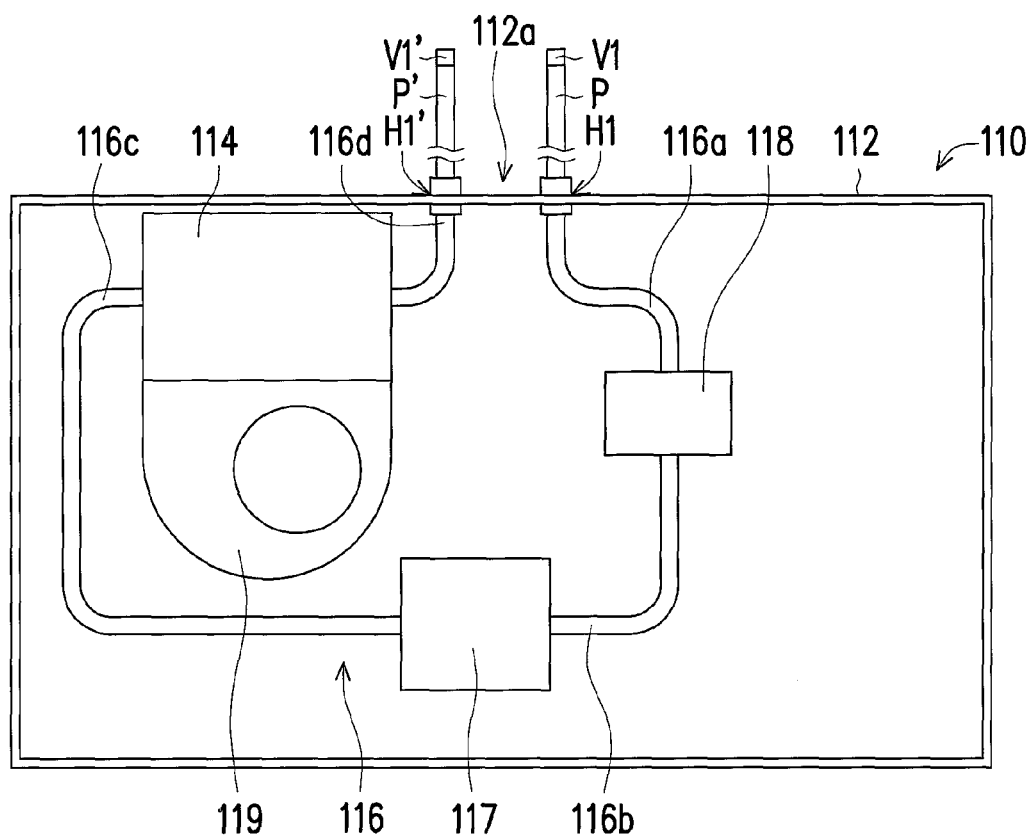
FIG. 2 is a schematic diagram showing a part of components of an expansion base in FIG. 1.

FIG. 2 is a schematic diagram showing a part of components of an expansion base in FIG. 1. Please refer to FIG. 2, the expansion base 110 includes a base body 112, a liquid cooler 114, a first pipe line 116 and a driving unit 118. The base body 112 includes a first connecting portion 112a. The liquid cooler 114 is disposed in the base body 112 and connected to the first connecting portion 112a via the first pipe line 116. The driving unit 118 (such as a pump) is connected to the first pipe line 116.

Figure 3:
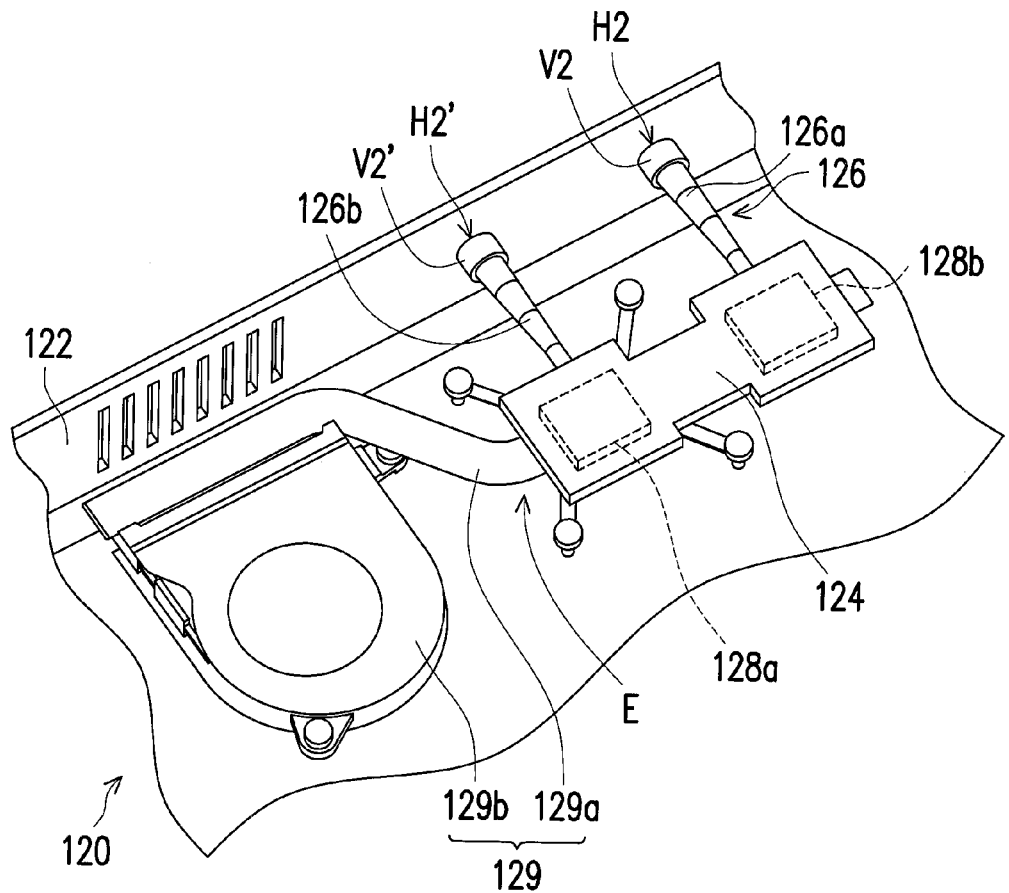
FIG. 3 is a schematic diagram showing a part of components of the electronic device in FIG. 1.

FIG. 3 is a schematic diagram showing a part of components of the electronic device in FIG. 1. The electronic device 120 includes a main body 122, a liquid block 124 and a second pipe line 126. The main body 122 includes a second connecting portion 122a (as showed in FIG. 1). The liquid block 124 is disposed in the main body 122 and connected to the second connecting portion 122a via the second pipe line 126. In addition, the main body 122 of the electronic device 120 includes two heating elements 128a, 128b (such as a CPU and a GPU of the notebook computer) contacting the liquid block 124, and the number of the heating elements is not limited herein.

As shown in FIG. 1, the first connecting portion 112a of the expansion base 110 shown in FIG. 2 connects to the second connecting portion 122a of the electronic device 120 shown in FIG. 3 to form a circulation flow channel passing through the liquid cooler 114, the first pipe line 116, the second pipe line 126 and the liquid block 124. The driving unit 118 in the base body 112 of expansion base 110 drives heat exchange medium (such as water) to flow in the circulation flow channel to cool the heating elements 128a, 128b of the electronic device 120, and to improve a heat dissipating efficiency of the electronic device 120.

In detail, as shown in FIG. 2, in the embodiment, the first connecting portion 112a of the expansion base 110 includes two first pipe holes H1 and H1'. The first pipe line 116 in the base body 112 is connected to the first pipe holes H1 and H1'.

As shown in FIG. 3, in the embodiment, the second connecting portion 122a of the electronic device 120 includes two second pipe holes H2 and H2', and the second pipe line 126 in the main body 122 is connected to the second pipe holes H2 and H2'. As shown in FIG. 1, the first pipe holes H1 and H1' of the expansion base 110 are connected to the second pipe holes H2 and H2' of the electronic device 120 via two pipes P, P'.

Further in detail, as shown in FIG. 2, the first pipe line 116 of the expansion base 110 includes a plurality of segments 116a to 116d. The segment 116a is connected between the first pipe hole H1 and the driving unit 118, the segment 116b is connected between the driving unit 118 and the receiving recess 117, the segment 116c is connected between the receiving recess 117 and the liquid cooler 114, and the segment 116d is connected between the liquid cooler 114 and the first pipe hole H1'.

As shown in FIG. 3, the second pipe line 126 of the electronic device 120 includes two segments 126a and 126b. The segment 126a is connected between the liquid block 124 and the second pipe hole H2, and the segment 126b is connected between the liquid block 124 and the second pipe hole H2'.

As shown in FIG. 2, in the embodiment, the expansion base 110 further includes a receiving recess 117 and a heat dissipating fan 119. The receiving recess 117 connects the liquid cooler 114 and the first pipe line 116, and it is adapted to receive the heat exchange medium. The heat dissipating fan 119 is disposed in the base body 112, and it provides cooling air to the liquid cooler 114.

When the driving unit 118 is enabled in the expansion base 110, the heat exchange medium passes through the liquid block 124 in the electronic device 120, and the heat generated by the heating elements 128a and 128b is transferred to the heat exchange medium. The heat exchange medium passes through the segment 126a of the second pipe line 126, the second pipe hole H2, the pipe P, the first pipe hole H1, the segment 116a of the first pipe line 116, the driving unit 118, the segment 116b of the first pipe line 116, the receiving recess 117 and the segment 116c of the first pipe line 116 in sequence and reaches the liquid cooler 114, and the heat is dissipated via the liquid cooler 114 and the heat dissipating fan 119.

After the heat exchange medium is cooled down by the liquid cooler 114 and the heat dissipating fan 119, the heat exchange medium passes through the segment 116d of the first pipe line 116, the first pipe hole H1', the pipe P', the second pipe hole H2' and the segment 126b of the second pipe line 126 in sequence and reaches the liquid block 124, so as to continuously cool the heating elements 128a and 128b in a circulation way.

Please refer to FIG. 3, in the embodiment, the electronic device 120 further includes a heat dissipating module 129 which includes a heat pipe 129a and a heat dissipating fan 129b. An end E of the heat pipe 129a is connected to the heating elements 128a and 128b, and the liquid block 124 wraps the end E of the heat pipe 129a to integrate the heat dissipating module 129 and the liquid block 124.

When the electronic device 120 operates in low power (such as web browsing or word processing), the heat dissipating module 129 cools the heating elements 128a and 128b. When the electronic device 120 operates in high power (such as playing computer games), the heating elements 128a and 128b have a higher heating power, and the driving unit 118 of the expansion base 110 can be enabled to cool the heating elements 128a and 128b in the liquid cooling way.

As shown in FIG. 1, in the embodiment, when the electronic device 120 is combined to the expansion base 110, the expansion base 110 is electrically connected to the electronic device 120, and then the driving unit 118 can be enabled via a signal from the electronic device 120 (as shown in FIG. 2). For example, an option icon may be shown at a display of the electronic device 120, or a physical button is disposed at the electronic device 120 for the user to press, so as to generate the signal to enable the driving unit 118. In other embodiments, the driving unit 118 can be enabled in other ways, which is not limited herein.

Please refer to FIG. 2, in the expansion base 110, the first connecting portion 112a includes two first check valves V1 and V1', and the first check valves V1 and V1' are disposed at the ends of the two pipes P and P', respectively. Please refer to FIG. 3, in the electronic device 120, the second connecting portion 122a includes two second check valves V2 and V2', and the second check valves V2 and V2' are disposed at the second pipe holes H2 and H2', respectively.

The first check valves V1 and V1' can be jointed to the second check valves V2 and V2', respectively, so as to make the pipes P and P' connected to the second pipe holes H2 and H2'. As a result, when the pipes P and P' are detached from the second pipe holes H2 and H2', the leakage of the heat exchange medium can be avoided via the check valves.

Figure 4:
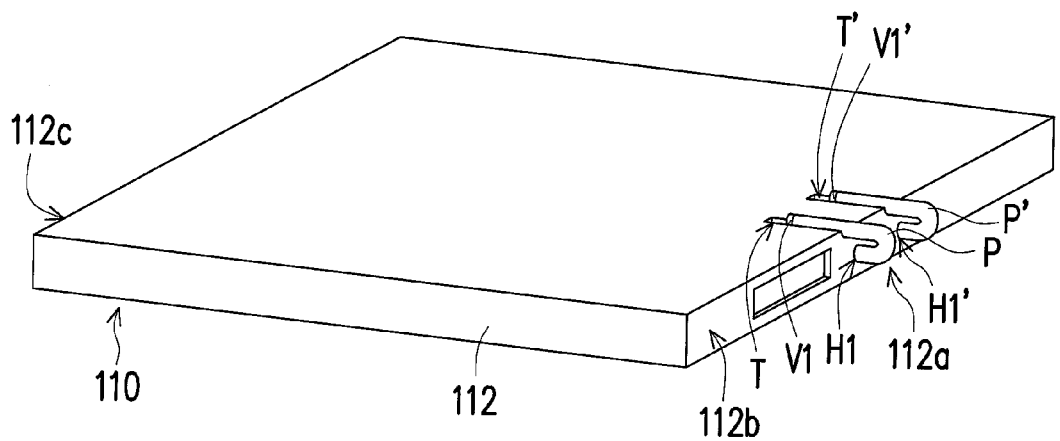
FIG. 4 is a schematic diagram showing that pipes in FIG. 1 are received in a groove of a base body.

FIG. 4 is a schematic diagram showing that pipes in FIG. 1 are received in a groove of a base body. Please refer to FIG. 1 and FIG. 4, in the embodiment, the base body 112 of the expansion base 110 includes two grooves T and T' at the outside. If the expansion base 110 is not used, the pipes P and P' can be fixed and received at the grooves T and T'. In other embodiments, the pipes P, P' can be fixed in other ways, which is not limited herein.

Please refer to FIG. 2, in the embodiment, the receiving recess 117 is separated from the liquid cooler 114, and actuation of the driving unit 118 can be set as follows. When the electronic device 120 sends the signal to stop the driving unit 118, the driving unit 118 first concentrates the heat exchange medium in the circulation flow channel to the receiving recess 117, and then the driving unit 118 stops. As a result, the pipes P and P' are detached from the second pipe holes H2 and H2', and the leakage of the heat exchange medium is avoided.

Figure 5:
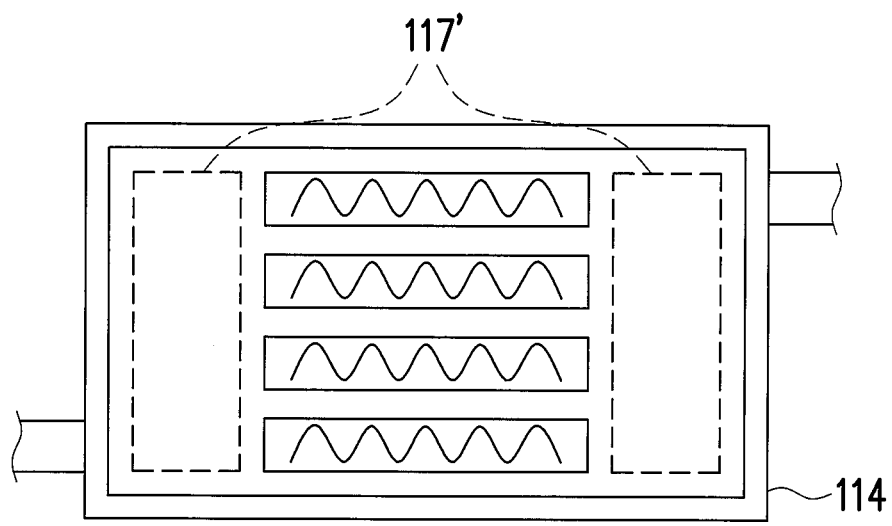
FIG. 5 is a schematic diagram showing a liquid cooler and a receiving recess in another embodiment.

The position of the receiving recess is not limited herein. FIG. 5 is a schematic diagram showing a liquid cooler and a receiving recess in another embodiment. As shown in FIG. 5, in the embodiment, the receiving recess 117' for receiving the heat exchange medium is not the same as the receiving recess 117 in FIG. 2 which is detached from the liquid cooler 114. The receiving recess 117' is integrated to the liquid cooler 114.

Figure 6:
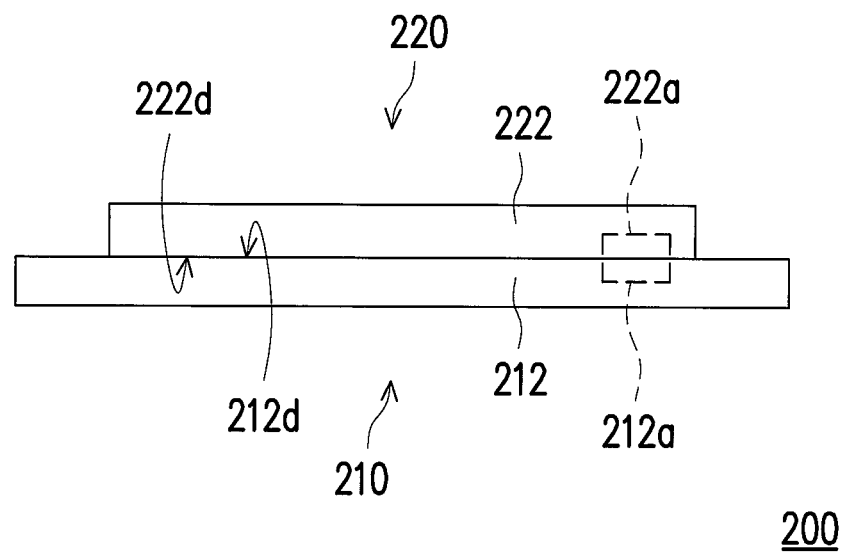
FIG. 6 is a side view showing an electronic system in another embodiment.

FIG. 6 is a side view showing an electronic system in another embodiment. In the embodiment, an electronic device 220 is also a notebook computer, which is not limited herein. In an electronic system 200, the configuration and operation of an expansion base 210 and the electronic device 220 are similar with that of the expansion base 110 and the electronic device 120 of the electronic system 100, which are omitted herein.

The difference between the electronic system 200 and the electronic system 100 is that a second connecting portion 222a and a check valve of the electronic device 220 are disposed at a bottom surface 222d of a main body 222. A first connecting portion 212a and a check valve of an expansion base 210 are disposed at a top surface 212d of a base body 212, and the second connecting portion 222a is directly connected to the first connecting portion 212a of the expansion base 210.

Figure 7:
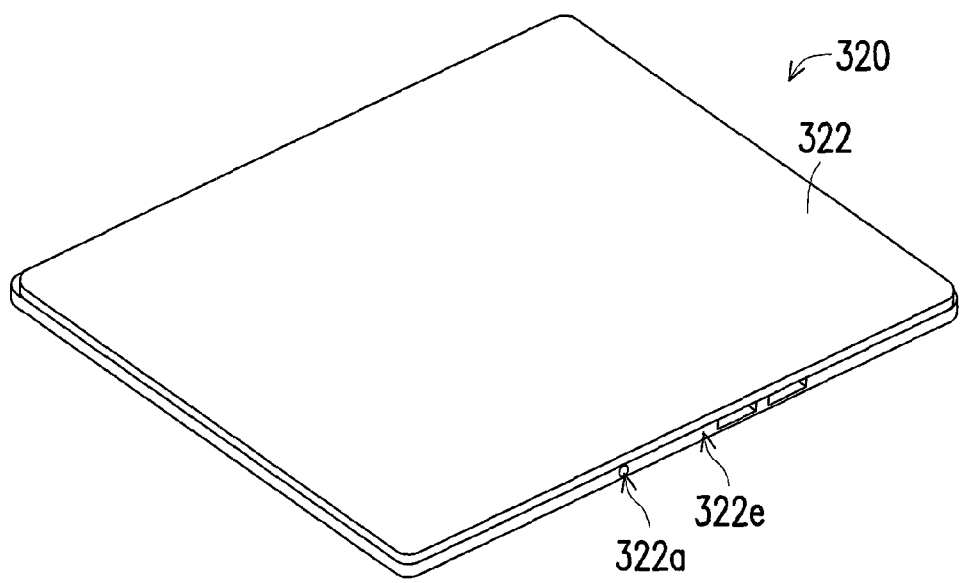
FIG. 7 is a stereogram showing an electronic device in another embodiment.
Figure 8:
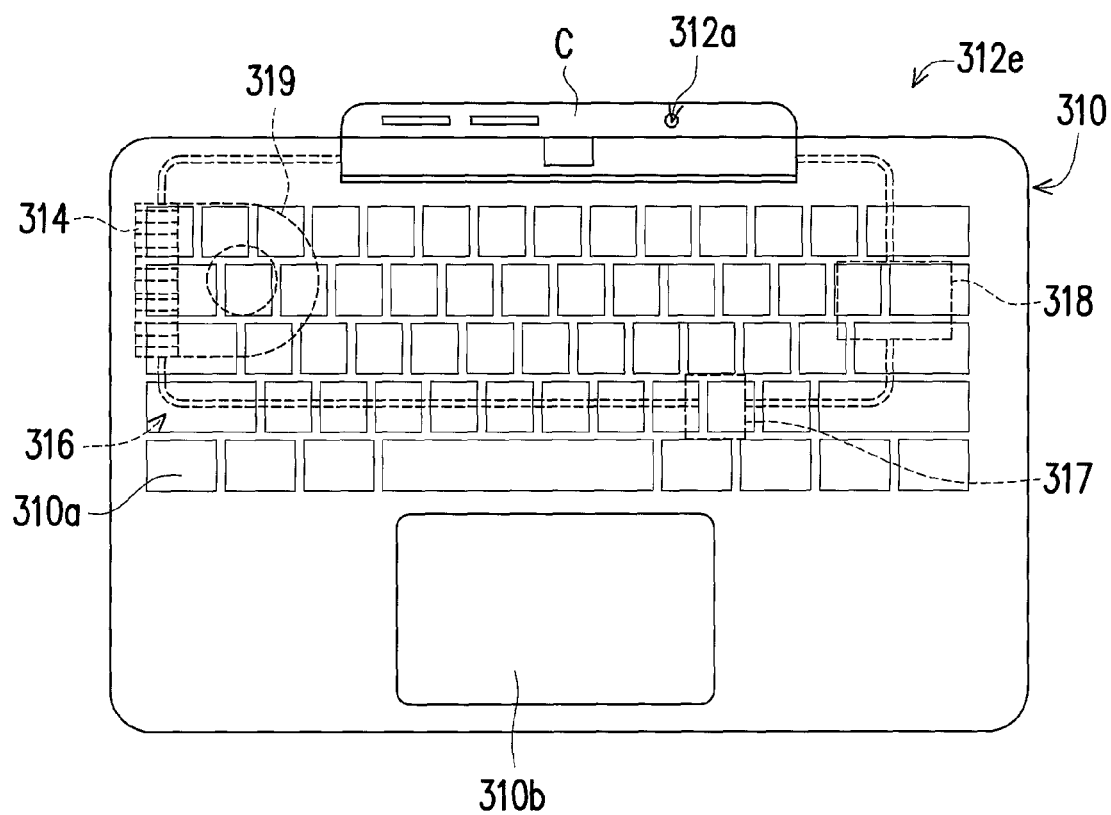
FIG. 8 is a schematic diagram showing an expansion base adapted to the electronic device in FIG. 7.
Figure 9:
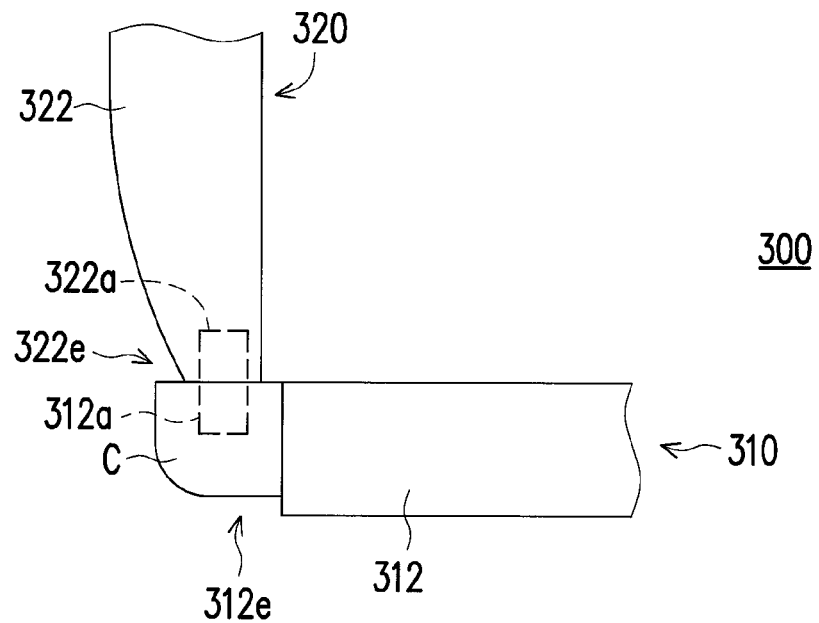
FIG. 9 is a side view showing that the electronic device in FIG. 7 is inserted to the expansion base in FIG. 8.

FIG. 7 is a stereogram showing an electronic device in another embodiment. FIG. 8 is a schematic diagram showing an expansion base adapted to the electronic device in FIG. 7. FIG. 9 is a side view showing that the electronic device in FIG. 7 is inserted to the expansion base in FIG. 8. Please refer to FIG. 7 to FIG. 9, in the embodiment, an electronic device 320 is a tablet computer, which is not limited herein.

In an electronic system 300, the configuration and operation of an expansion base 310 and the electronic device 320 are similar with those of the expansion base 110 and the electronic device 120 of the electronic system 100, which are omitted herein.

The difference between the electronic system 300 and the electronic system 100 is that a second connecting portion 322a and the check valve of the electronic device 320 are disposed at a bottom side 322e of a main body 322. A first connecting portion 312a and a check valve of an expansion base 310 are disposed at an inserting portion C, which is at a back side 312e of a base body 312. As shown in FIG. 9, the electronic device 320 can be inserted to the inserting portion C of the expansion base 310, and the second connecting portion 322a of the electronic device 320 is directly connected to the first connecting portion 312a of the expansion base 310.

In FIG. 7 and FIG. 8, in the embodiment, the expansion base 310 includes a keyboard 310a and a touch panel 310b for expanding the functions of a tablet computer (which is the electronic device 320), and a liquid cooler 314, a first pipe line 316, a receiving recess 317 and a driving unit 318 of the expansion base 310 can provide a liquid cooling function, which are similar with the liquid cooler 114, the first pipe line 116, the receiving recess 117 and the driving unit 118 in FIG. 2. In other words, in the embodiment, the liquid cooling function is integrated to the expansion base 310 with an input function. In other embodiments, the liquid cooling function can be integrated to an expansion base with other expanding functions, which is not limited herein.

Figure 10:
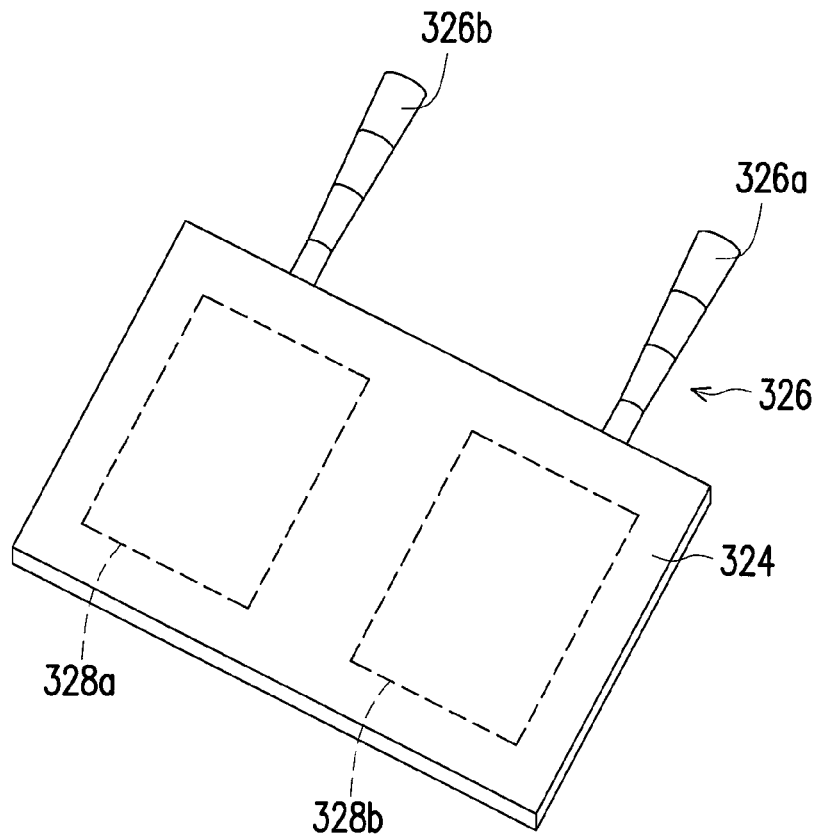
FIG. 10 is a schematic diagram showing a liquid block, a heating element and a second pipe line of the electronic device shown in FIG. 7.

FIG. 10 is a schematic diagram showing a liquid block, a heating element and a second pipe line of the electronic device shown in FIG. 7. In FIG. 10, the configuration and operation of a liquid block 324, a heating element 328a, a heating element 328b, a second pipe line 326 and two segments 326a and 326b of the second pipe line 326 are similar with that of the liquid block 124, the heating element 128a, the heating element 128b, the second pipe line 126 and the segments 126a and 126b of the second pipe line 126, which are omitted herein.

The difference between the embodiments in FIG. 10 and FIG. 3 is that the liquid block 324 is not the same as the liquid block 124 in FIG. 3 which is connected to the heat dissipating module 129. When the liquid cooling function of the electronic system 300 is not enabled, the liquid block 324 can be regarded as cooling fins which cools the heating elements 328a and 328b. When the liquid cooling function of the electronic system 300 is enabled, the liquid block 324 cooperates with the second pipe line 326 and the liquid cooler 314, the first pipe line 316, the receiving recess 317 and the driving unit 318 in the expansion base 310 to cool the heating elements 328a, 328b in the liquid cooling way.

Although the disclosure has been disclosed with reference to certain preferred embodiments thereof, the disclosure is not for limiting the scope. Persons having ordinary skill in the art may make various modifications and changes without departing from the spirit and the scope of the disclosure. Therefore, the scope of the appended claims should not be limited to the description of the preferred embodiments described above.

What is claimed is:

1. An electronic system, comprising:
   an expansion base including:
   a base body including a first connecting portion, the first connecting portion includes two first pipe holes each extending through a wall of the base body, the two first pipe holes are each connected to a respective one of two pipes, two check valves respectively disposed at the ends of the two pipes;
   a first pipe line disposed in the base body;
   a liquid cooler connected to the first connecting portion via the first pipe line;
   a receiving recess that is connected to the liquid cooler via the first pipe line, and the receiving recess is separated from the liquid cooler; and
   a driving unit connected to the first pipe line; and
   an electronic device including:
   a main body including a second connecting portion, the second connecting portion includes two second pipe holes each extending through a wall of the electronic device, and each of the first pipe holes are connected to the second pipe holes using a respective one of the two pipes and a respective one of the two check valves;
   a second pipe line connected to the second connecting portion; and
   a liquid block connected to the second connecting portion via the second pipe line,
   wherein the first connecting portion is connected to the second connecting portion to form a circulation flow channel, and
   wherein a heat exchange medium in the circulation flow channel is driven by the driving unit to pass through one of the two check valves, one of the two pipes, one of the first pipe holes, the driving unit, the receiving recess, the liquid cooler, another of the first pipe holes, another of the pipes, and another of the check valves in sequence.

2. The electronic system according to claim 1, wherein the expansion base includes a heat dissipating fan disposed in the base body, and the heat dissipating fan provides cool air to the liquid cooler.

3. The electronic system according to claim 1, wherein the driving unit drives the heat exchange medium to concentrate in the receiving recess.

4. The electronic system according to claim 1, wherein the expansion base is electrically connected to the electronic device, and the driving unit is enabled via a signal from the electronic device.

5. An expansion base, applied to an electronic device, wherein the expansion base comprises:

a base body including a connecting portion, wherein the connecting portion includes two pipe holes each extending through a wall of the base body, two pipes each connected to a respective one of the two pipe holes and two check valves respectively disposed at the ends of the two pipes;

a pipe line disposed in the base body and connected to the connecting portion;

a liquid cooler connected to the connecting portion via the pipe line;

a receiving recess, connected to the liquid cooler via the pipe line, wherein the receiving recess is separated from the liquid cooler; and a driving unit connected to the pipe line, wherein the driving unit is used to drive a heat exchange medium to pass through one of the two check valves, one of the two pipes, one of the pipe holes, the driving unit, the receiving recess, the liquid cooler, another of the pipe holes, another of the pipes, and another of the check valves in sequence.

* * * * *